United States Patent [19]
Sakagami et al.

[11] Patent Number: 5,233,557
[45] Date of Patent: Aug. 3, 1993

[54] MEMORY CONTROL DEVICE

[75] Inventors: Masahiko Sakagami, Osaka; Yoshikazu Maeyama, Kyoto, both of Japan

[73] Assignee: Matsushita Electric Industrial Co., Ltd., Osaka, Japan

[21] Appl. No.: 723,613

[22] Filed: Jul. 1, 1991

[30] Foreign Application Priority Data

Jun. 29, 1990 [JP] Japan .................. 2-173470

[51] Int. Cl.⁵ .............................................. G11C 7/00
[52] U.S. Cl. ...................... 365/189.01; 365/189.04; 365/189.05; 365/194; 365/189.08
[58] Field of Search ............... 365/189.01, 189.04, 365/189.05, 220, 221, 194, 189.08

[56] References Cited

U.S. PATENT DOCUMENTS

| | | | |
|---|---|---|---|
| 4,815,039 | 3/1989 | Tai et al. | 365/189 |
| 5,022,011 | 6/1991 | Allan | 365/189.01 |
| 5,031,150 | 7/1991 | Ohsawa | 365/193 |

FOREIGN PATENT DOCUMENTS

WO84/03011  2/1984  PCT Int'l Appl. .

*Primary Examiner*—William L. Sikes
*Assistant Examiner*—Scott A. Ouellete
*Attorney, Agent, or Firm*—Wenderoth, Lind & Ponack

[57] ABSTRACT

A memory control device for controlling a random access memory provides with an arbiter for generating write start and read start signals in response to WRITE and READ commands which are obtained by frequency-dividing writing and reading clock signals, respectively and a memory control circuit comprised of first and second delay circuits for delaying the write start and read start signals by predetermined times, respectively, and first and second RS flip-flop circuits for generating write and read control signals in response to the write start and read start signals, respectively, which are reset by reset signals output from the first and second delay circuits, respectively.

1 Claim, 6 Drawing Sheets able to read

MEMORY CONTROL DEVICE

BACKGROUND OF THE INVENTION

1. Field of the Invention

The present invention relates to a memory control device for controlling writing and reading of data to a memory of a data storage device.

2. Description of the Prior Art

A great deal of data has been increasingly processed in accordance with the recent progress of informationized society, and recording and reproducing of the data has accordingly become more and more important. This forms the background of a strong demand for higher sophisticated recording and reproducing technique. Moreover, as the cost of semiconductor memories has been reduced because of the remarkable advancement of the technique, a high-speed semiconductor memory with large capacity has been often used as a recording medium of data.

FIG. 4 shows an example of a data recording/reproducing system using a semiconductor memory (referred to as a RAM hereinafter) as a data recording medium. Numerals 31-33 designate respectively a RAM, an arbiter and a memory control device. For example, when a READ demand is input to the arbiter 32 while RAM 31 is in writing data, it instructs the memory control device 33 to stop generation of a reading start signal RST until RAM 31 finishes writing and then to generate a reading start signal RST. On the contrary, if a WRITE demand is input thereto while RAM 31 is in reading out data, instructs the memory control device 33 to stop generation of a writing start signal WST until RAM. 31 finishes reading and to generate a writing start signal WST thereafter. Therefore, the memory control device 33 generates a signal to control RAM 31 based on the output result of the arbiter 32.

An example of the above memory control device 33 is shown in FIG. 5. The memory control device 33 consists of synchronous delay circuits 41 and 43 which are synchronized with writing and reading clock signals WCLK and RCLK and RS flip-flop circuits (referred to as an RS.FF hereinafter) 42 and 44. The writing start signal WST is connected to an input of the synchronous delay circuit 41 and a set input (referred to as an S input hereinafter) of RS.FF 42. On the other hand, an output of the synchronous delay circuit 41 is connected to a reset input (referred to as an R input hereinafter) of RS.FF 42. Further, the reading start signal RST is connected to an input of the other synchronous delay circuit 43 and an S input of RS.FF 44, while an output of the synchronous delay circuit 43 is connected to an R input of RS.FF 44.

The fundamental operation of the memory control device 33 will be explained with reference to FIG. 6.

When a WRITE demand signal generated by frequency-dividing writing clocks WCLKs is input to the arbiter 32, it generates a writing start signal WST in response thereto. This signal WST is input to the synchronous delay circuit 41 and to the S input of the RS.FF 42.

Since the S and R inputs of RS.FF 42 become "H" and "L" at that timing, the Q output of the same, i.e. the writes control signal WRT is turned "H" and, thereby, RAM 31 write into WRITE data. The synchronous delay circuit 41 delays the write start signal WST by a predetermined number of the writing clocks WCLKs and, thereafter, outputs a WRITE reset signal WRS to the R-input of RS.FF 42 to reset the same. Namely, RAM 31 is able to perform data writing for a delay time by the synchronous delay circuit 41.

Similarly, when a READ start signal WST is input to the S input of the RS.FF 44, the same outputs a READ control signal RED to enable RAM 31 to perform data reading and a READ reset signal RRS delayed by the synchronous delay circuit 43 is input to the R input of RS.FF 44 to reset the same.

In the manner as described above, when the number of delay clocks corresponding to the time necessary for the operation of RAM 31 is set in each of the synchronous delay circuits 42 and 44, it becomes possible to generate the writing control signal WRT or reading control signal RED to RAM 31 without competition with each other.

In the above arrangement of the memory control device, if the writing clock WCLK input to the synchronous delay circuit 41 has the same frequency as the reading clock RCLK input to the synchronous delay circuit 43, no particular problem is noticed.

However, a problem occurs when the writing clock WCLK is stopped. As shown in FIG. 6, when the writing start signal WST is "H", the writing control signal WRT becomes "H', so that data is written into RAM 31. If the writing clock WCLK alone is stopped in this state, the writing control signal WRT is retained "H", thereby causing RAM 31 to keep the writing condition. As a result, RAM 31 cannot read even if the reading clock RCLK is input. Likewise, while RAM 31 is in the reading state, if the reading clock RCLK is stopped without stopping the writing clock WCLK, RAM 31 cannot write. Also, in the case where the frequency of either the writing clock WCLK or reading clock RCLK is lowered, it brings about the same trouble as above.

In addition, if the frequency of the writing clock WCLK or reading clock RCLK is raised, the writing time or reading time to RAM 31 becomes insufficient thereby to cause an erroneous operation or a destruction of data.

As such, the memory control device 33 in the structure described above is not applicable to a system wherein either one or both of the writing clock WCLK and reading clock RCLK change its frequency, or a system wherein the writing clock WCLK or reading clock RCLK is stopped. In a system using the memory control device 33 of the above-described structure as well, it is impossible to change the frequency of either or both of the writing clock WCLK and reading clock RCLK, or to stop the writing clock WCLK or reading clock RCLK.

SUMMARY OF THE INVENTION

An essential object of the present invention is to provide a memory control device enabling writing and reading of data even when either or both of a writing clock and a reading clock change its frequency, or when a writing clock or a reading clock is brought to a halt.

In accomplishing the above-described object, according to the present invention, a memory control device is provided which consists of asynchronous delay circuits to delay an input signal and RS.FFs, wherein an input to each of the asynchronous delay circuits is connected to each S input of respective RS.FFs and an output from each of the asynchronous delay circuits is connected to each R input of respective RS.FFs, thereby generating a memory control signal.

BRIEF DESCRIPTION OF THE DRAWINGS

This and other objects and features of the present invention will become apparent from the following description taken in conjunction with one preferred embodiment thereof with reference to the accompanying drawings, in which.

DESCRIPTION OF THE PREFERRED EMBODIMENT

Figure 1:
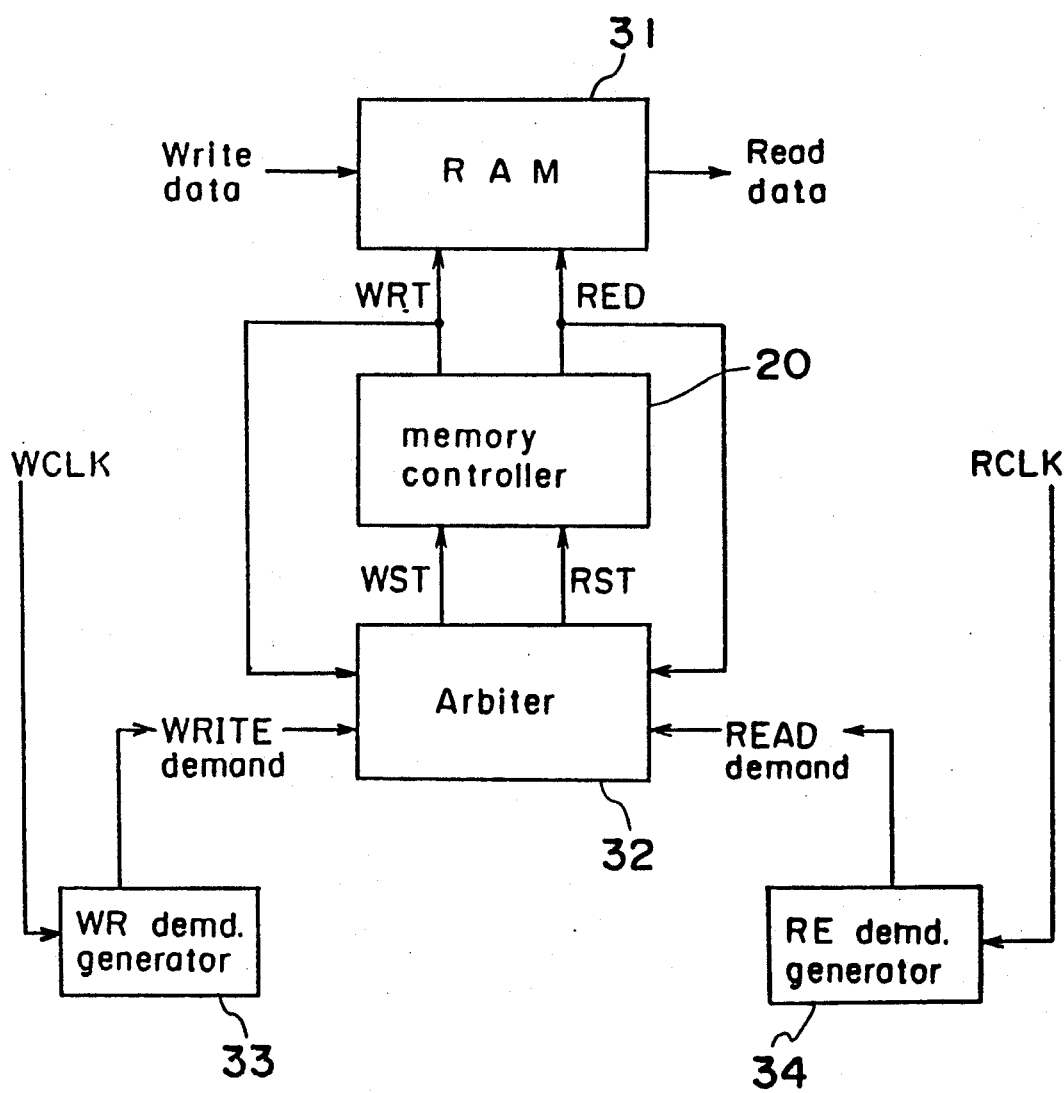
FIG. 1 is a block diagram of a memory control device according to one preferred embodiment of the present invention.

Before the description of the present invention proceeds, it is to be noted here that like parts are designated by like reference numerals throughout the accompanying drawings.

FIG. 1 shows a composition of the memory control device according to the preferred embodiment of the present invention.

The memory control device is substantially comprised of an arbiter 32 for generating writing and reading start signals WST and RST without competing these two signals with each other and a memory control circuit 20 for outputting WRITE and READ control signals WRT and RED responsive to the writing and reading start signals WST and RST, respectively.

Figure 2:
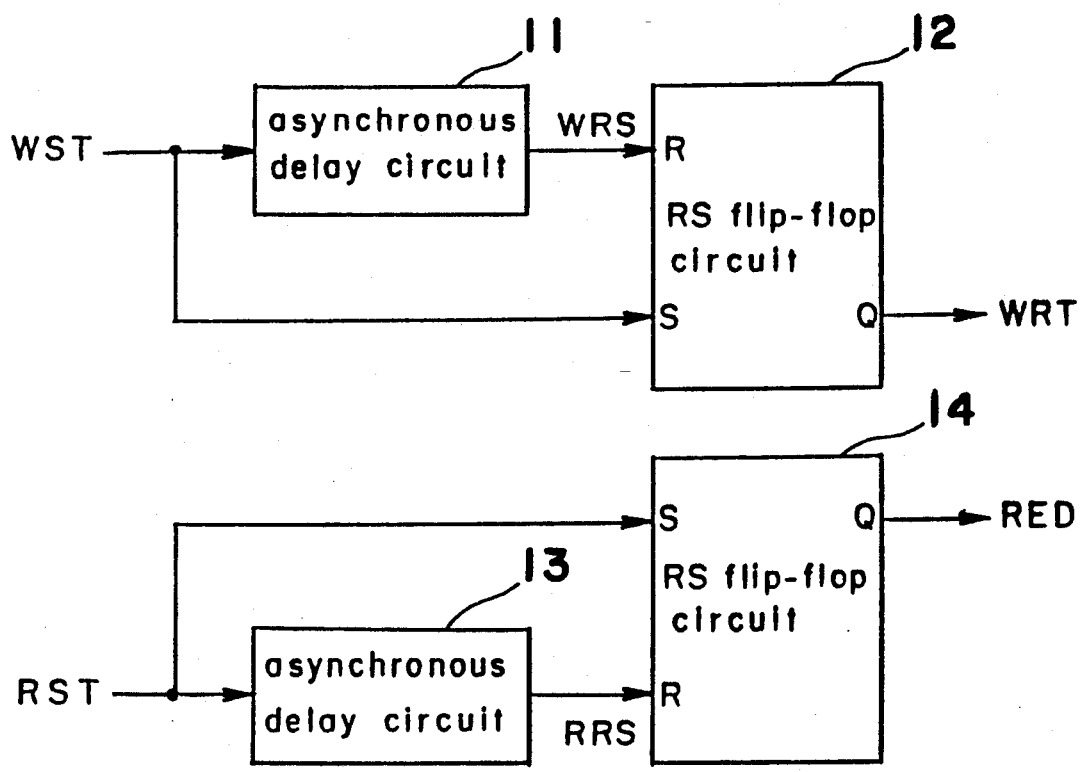
FIG. 2 is a block diagram of the memory control circuit employed in the preferred embodiment of the present invention.

A composition of the memory control circuit 20 is shown in FIG. 2.

As is clear from comparison of FIG. 2 with FIG. 4, the memory control circuit 20 of the present invention is comprised of two delay circuit 11 and 13 which are not synchronized with writing and reading clock signals WCLK and RCLK (herein after referred to as first and second asynchronous delay circuits, respectively) and two RS.FFs 12 and 14.

A writing start signal WST is input to the first asynchronous delay circuit 11 and the S input of RS.FF 12 and, thereby, a write control signal WRT is output from the Q output thereof. The first asynchronous delay circuit 11 outputs a write reset signal WRS after delaying the writing start signal WST by a predetermined time which is set equal to a time necessary for writing data into RAM 31. When the write reset signal WRS is input to the R input of RS.FF 12, the same is reset and, therefore, the Q output WRT thereof is turned "L".

Similarly, when a reading start signal RST is input to the S input of RS.FF 14, the same is set and, thereby, the Q output thereof i.e., the read control signal RED is turned "H". And, the second asynchronous delay circuit 13 outputs a write reset signal WRS to the R input of RS.FF 14 after delaying the writing start signal WST by a predetermined time which is set equal to a time necessary for reading out data from RAM 31.

Figure 3:
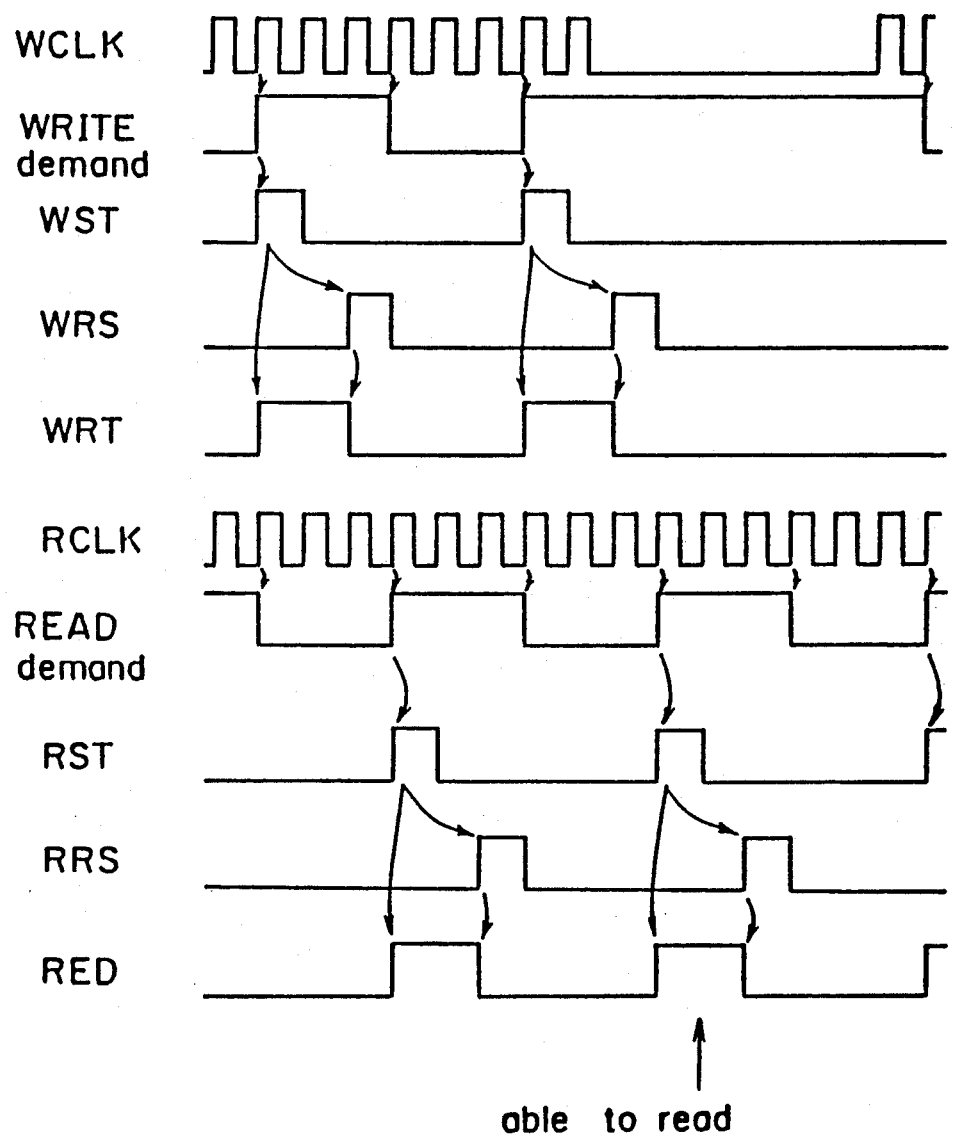
FIG. 3 is a timing chart of the operation of the memory control device.

FIG. 3 shows a time chart of the memory control device shown in FIG. 1.

When a WRITE demand is input to the arbiter 32 from a WRITE demand signal generator 33 which generates it by frequency-dividing the write clock signals WCLKs, the arbiter 32 generates a write start signal WST to input to the memory control circuit 20. When the write start signal WST is input to the S input of RS.FF 12, the same is set to output a write control signal WRT to RAM 31 and, thereby, RAM 31 performs a data writing. Then, the first asynchronous delay circuit 11 outputs a write reset signal WRS to the R input of RS.FF 12 and, thereby, RS.FF 12 is reset.

On the other hand, when a READ demand is input to the arbiter 32 from a READ demand signal generator 33, the arbiter 32 outputs a read start signal RST if the same does not compete with the write start signal WST. If the write start signal WST is kept in "H" level, at the time when the READ command is input to the arbiter 32, it waits generation of the read start signal RST until the write start signal WST is fallen down to "L" level.

When the read start signal RST is output from the arbiter 32, RS.FF 14 is set to generate a read control signal RED and RAM 31 performs a data reading thereby. After when the data reading is completed, RS.FF 14 is reset by a reset signal RST input from the second asynchronous circuit 13.

Figure 4:
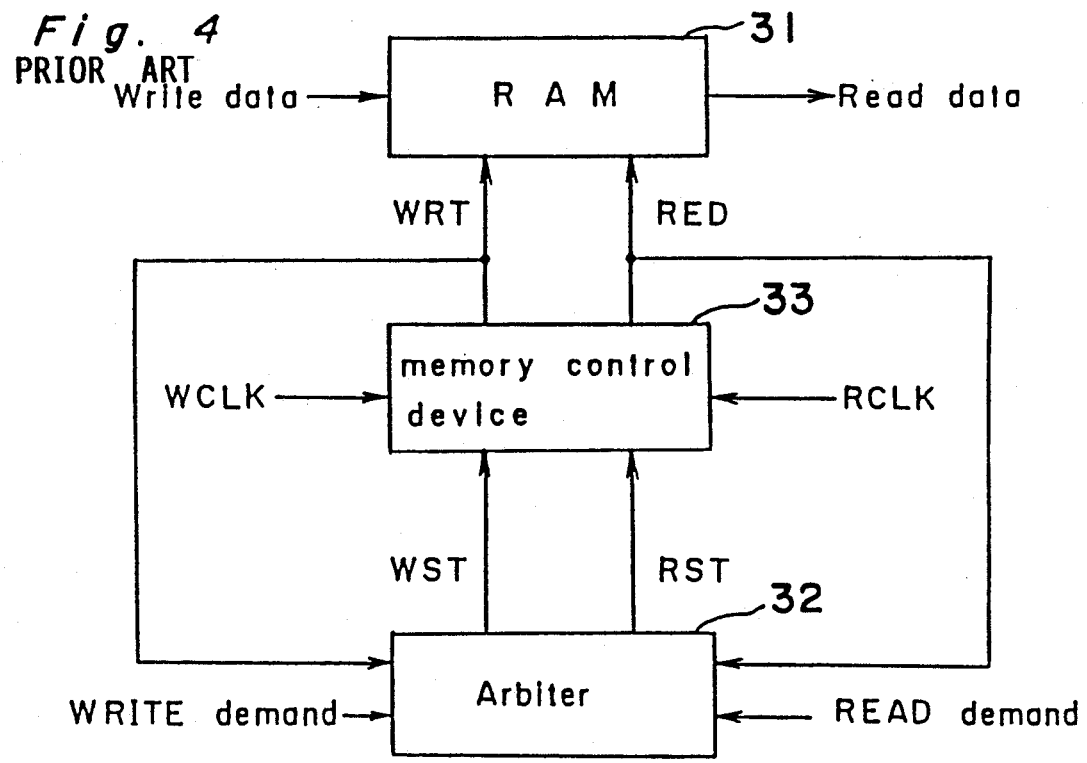
FIG. 4 is a block diagram showing the structure of a system using the memory control device.
Figure 5:
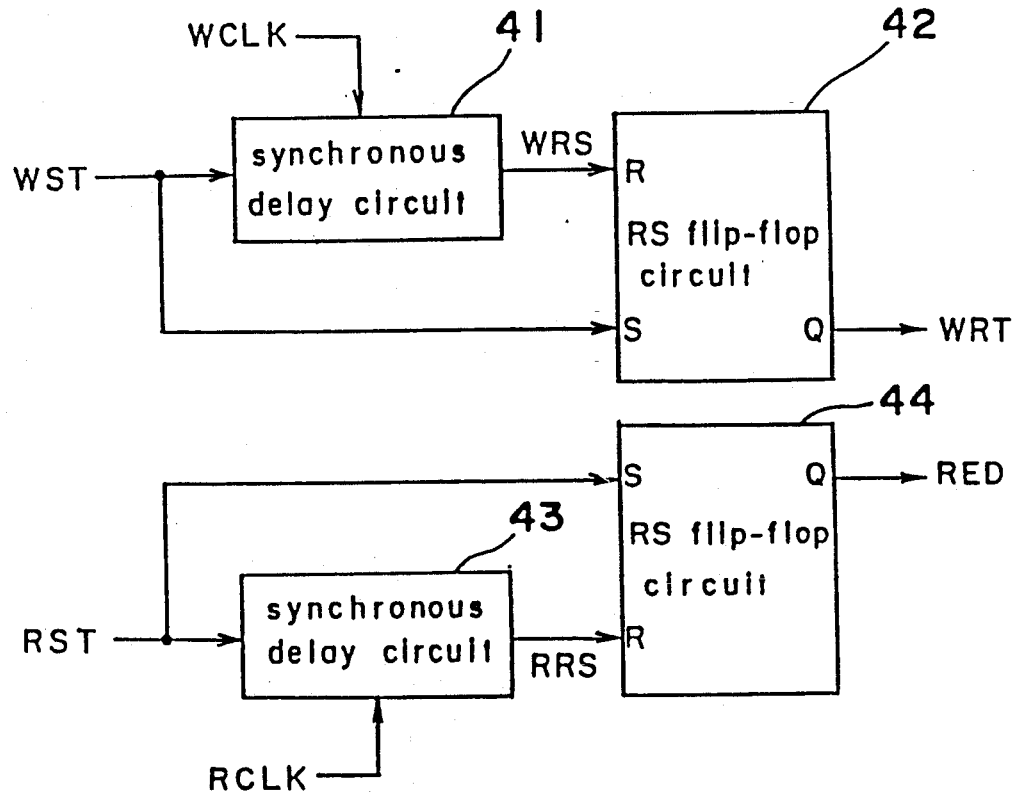
FIG. 5 is a block diagram of a conventional memory control device.
Figure 6:
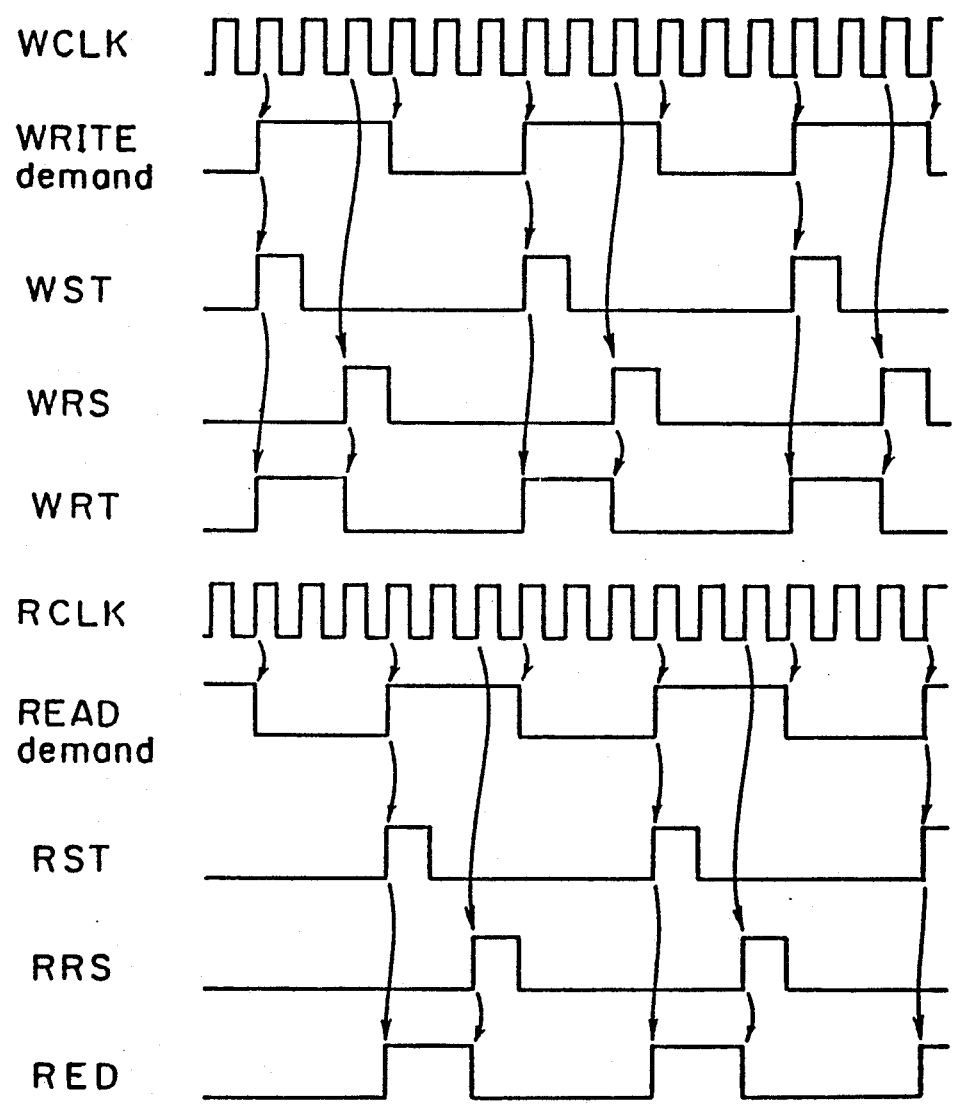
FIGS. 6 and 7 are timing charts of the operation of the conventional memory control device.
Figure 7:
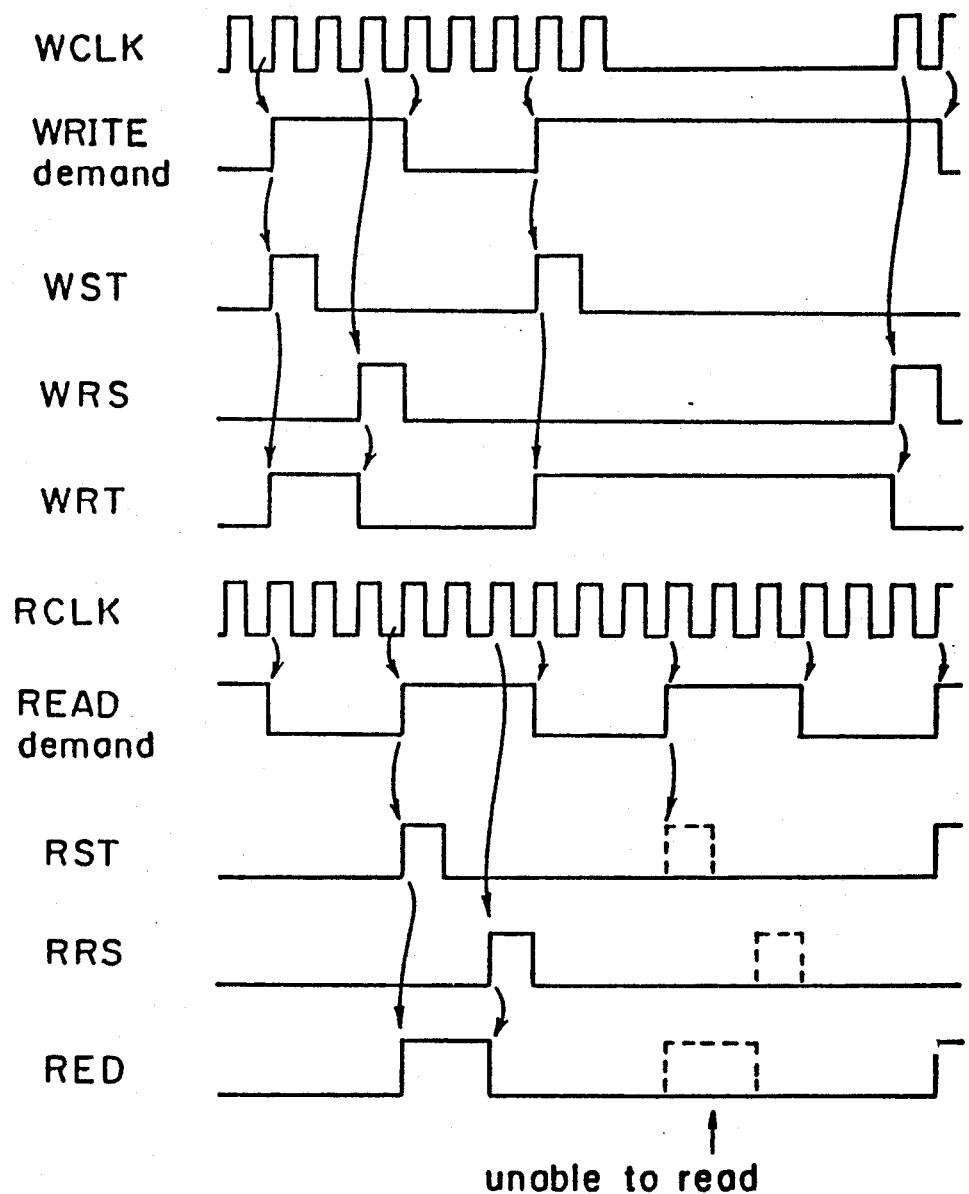

In the event that the memory control device of the above-described structure is used in a system of FIG. 4, if the frequency of the writing clock WCLK is the same as that of the reading clock RCLK and, neither the writing clock WCLK nor the reading clock RCLK are stopped, the memory control device of the present invention works in the same manner as the conventional memory control device.

Meanwhile, when the writing clock WCLK is stopped, the memory control device is driven in a manner as shown in FIG. 3. Since the output WRS of the first synchronous delay circuit 11 is output a predetermined delay time later in response to the writing start signal WST irrespective of the writing clock WCLK, the writing control signal WRT is output always for a predetermined time only. Similarly, in response to the reading start signal RST, the output RRS of the second asynchronous delay circuit 13 is output a predetermined delay time later irrespective of the reading clock RCLK, and therefore the reading control signal RRT is always output for a predetermined time.

Accordingly, if the delay time of the first asynchronous delay circuit 11 is set to a time necessary for RAM 31 to write, and moreover the delay time of the second asynchronous delay circuit 13 is set to a time necessary for RAM 31 to read, writing or reading can be carried out normally even when the frequency of either or both of the writing clock and reading clock is changed or when the writing clock or reading clock is stopped, although it cannot be achieved by the conventional device.

As is described hereinabove, the memory control device of the present invention is advantageous in its effectiveness to allow normal writing or reading of data to a memory even when the frequency of either or both of the writing clock and reading clock is changed or when the writing clock or reading clock is stopped. Moreover, the memory control device of the present invention is applicable to such a system as above in which the frequency of either or both of the writing clock and reading clock is changed or in which the writing clock or reading clock is stopped.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A memory control device for a random access memory which is comprised of an arbiter for generating write start and read start signals in response to WRITE and READ commands in such a manner that both signals do not overlap with each other and a memory control circuit for generating WRITE and READ control signals to enable said random access memory to perform data writing and data reading in response to said WRITE and READ control signals, respectively, wherein said WRITE and READ commands are generated by frequency-dividing writing and reading clock signals, respectively, being characterized in;

that said memory control circuit is comprised of first and second delay circuits and first and second RS flip-flop circuits;

that said write start signal is input to said first delay circuit and a set input of said first RS flip-flop circuit to generate said write control signal and said first delay circuit resets said first RS flip-flop circuit after a predetermined time from input of said write start signal irrespectively to said writing clock signals; and that said read start signal is input to said second delay circuit and a set input of said second delay circuit to generate said read control signal and said second delay circuits resets said second RS flip-flop after a predetermined time from input of said read start signal irrespectively to said reading clock signals.

* * * * *